(12) United States Patent
Daubenspeck et al.

(10) Patent No.: US 9,231,046 B2
(45) Date of Patent: Jan. 5, 2016

(54) CAPACITOR USING BARRIER LAYER METALLURGY

(71) Applicant: INTERNATIONAL BUSINESS MACHINES CORPORATION, Armonk, NY (US)

(72) Inventors: Timothy H. Daubenspeck, Colchester, VT (US); Jeffrey P. Gambino, Westford, VT (US); Zhong-Xiang He, Essex Junction, VT (US); Christopher D. Muzzy, Burlington, VT (US); Wolfgang Sauter, Hinesburg, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 35 days.

(21) Appl. No.: 13/840,132

(22) Filed: Mar. 15, 2013

(65) Prior Publication Data

US 2014/0264741 A1 Sep. 18, 2014

(51) Int. Cl.
| | |
|---|---|
| *H01L 21/02* | (2006.01) |
| *H01L 23/528* | (2006.01) |
| *H01L 23/522* | (2006.01) |
| *H01L 49/02* | (2006.01) |
| *H01L 27/08* | (2006.01) |
| *H01L 23/00* | (2006.01) |

(52) U.S. Cl.
CPC ............ *H01L 28/40* (2013.01); *H01L 23/5223* (2013.01); *H01L 24/11* (2013.01); *H01L 24/13* (2013.01); *H01L 27/0805* (2013.01); *H01L 28/60* (2013.01); *H01L 2224/13009* (2013.01); *H01L 2224/48463* (2013.01); *H01L 2924/14* (2013.01); *H01L 2924/19041* (2013.01)

(58) Field of Classification Search
CPC . H01L 23/5223; H01L 28/40; H01L 27/0805; H01L 24/13
USPC .................. 257/532, E21.011; 438/381, 396
See application file for complete search history.

(56) References Cited

U.S. PATENT DOCUMENTS

| | | | | |
|---|---|---|---|---|
| 4,439,813 | A * | 3/1984 | Dougherty ............. | H01G 2/065 29/25.42 |
| 6,100,155 | A * | 8/2000 | Hu ......................... | H01L 28/40 257/E21.008 |
| 6,417,535 | B1 * | 7/2002 | Johnson .............. | H01L 23/5223 257/296 |

(Continued)

FOREIGN PATENT DOCUMENTS

JP 969605 A 3/1997

OTHER PUBLICATIONS

J. Gambino et al., "Copper Interconnect Technology for the 32 nm Node and Beyond", IEEE 2009 Custom Integrated Circuits Conference (CICC), pp. 141-148.

*Primary Examiner* — Marvin Payen
*Assistant Examiner* — Jeremy Joy
(74) *Attorney, Agent, or Firm* — David Cain; Andrew M. Calderon; Roberts Mlotkowski Safran & Cole, P.C.

(57) ABSTRACT

A metal-insulator-metal (MIM) capacitor using barrier layer metallurgy and methods of manufacture are disclosed. The method includes forming a bottom plate of a metal-insulator-metal (MIM) capacitor and a bonding pad using a single masking process. The method further includes forming a MIM dielectric on the bottom plate. The method further includes forming a top plate of the MIM capacitor on the MIM dielectric. The method further includes forming a solder connection on the bonding pad.

20 Claims, 5 Drawing Sheets

(56) References Cited

U.S. PATENT DOCUMENTS

| | | | |
|---|---|---|---|
| 6,534,863 B2* | 3/2003 | Walker | H01L 21/76865 257/737 |
| 6,624,500 B2 | 9/2003 | Takafuji | |
| 7,072,168 B2* | 7/2006 | Horikawa | H01G 9/012 257/E23.062 |
| 7,332,764 B2* | 2/2008 | Choi | H01L 21/76841 257/296 |
| 7,442,633 B2 | 10/2008 | Bhattacharyya | |
| 7,557,003 B2* | 7/2009 | Kim | H01L 21/76852 438/239 |
| 7,687,867 B2 | 3/2010 | Coolbaugh et al. | |
| 7,823,260 B2 | 11/2010 | Kim | |
| 8,026,613 B2 | 9/2011 | Fogel et al. | |
| 8,110,414 B2 | 2/2012 | Cathey, Jr. et al. | |
| 2002/0017730 A1* | 2/2002 | Tahara | H01L 23/3114 257/786 |
| 2003/0089937 A1* | 5/2003 | Yamauchi | H01L 23/5223 257/296 |
| 2005/0212082 A1* | 9/2005 | Takeda | H01L 28/40 257/534 |
| 2005/0218473 A1* | 10/2005 | Wakisaka | H01G 4/228 257/528 |
| 2006/0262481 A1* | 11/2006 | Mashiko | H01G 4/228 361/306.2 |
| 2007/0120216 A1* | 5/2007 | Brigante | H01L 23/53214 257/499 |
| 2007/0176175 A1* | 8/2007 | Shioga | H01G 4/228 257/40 |
| 2007/0216027 A1* | 9/2007 | Okamura | H01L 23/5223 257/737 |
| 2008/0068780 A1* | 3/2008 | Shioga | H01G 4/008 361/524 |
| 2008/0119035 A1* | 5/2008 | Daubenspeck | B23K 1/0016 438/612 |
| 2009/0065836 A1* | 3/2009 | Kim | H01L 23/5223 257/296 |
| 2009/0110881 A1* | 4/2009 | Daubenspeck | H01L 21/563 428/138 |
| 2012/0092807 A1 | 4/2012 | Popovici et al. | |
| 2013/0285201 A1* | 10/2013 | Zhang | H01L 28/92 257/532 |

* cited by examiner

CAPACITOR USING BARRIER LAYER METALLURGY

FIELD OF THE INVENTION

The invention relates to semiconductor structures and, more particularly, to a metal-insulator-metal (MIM) capacitor using barrier layer metallurgy and methods of manufacture.

BACKGROUND

Metal-insulator-metal (MIM) capacitors are used in many integrated electronic circuits in technologies including analog, microwave, and radio frequency systems. In fact, MIM capacitors have become indispensible for RF technology.

MIM capacitors are comprised of two metal plates separated by an insulator material. These MIM capacitors are formed by deposition of the metal layers and insulator layer and etching processes, using conventional CMOS technologies, e.g., lithography, deposition and etching processes. Typically, the formation of such MIM capacitors requires extensive use of lithography masking which is a time consuming and expensive process. For example, MIM capacitors can be formed in Al or Cu BEOL processes, which require several masking steps. These masking steps, though, incur additional fabrication costs. Accordingly, there exists a need in the art to overcome the deficiencies and limitations described hereinabove.

SUMMARY

In an aspect of the invention, a method of forming a structure comprises forming a bottom plate of a metal-insulator-metal (MIM) capacitor and a bonding pad using a single masking process. The method further comprises forming a MIM dielectric on the bottom plate. The method further comprises forming a top plate of the MIM capacitor on the MIM dielectric. The method further comprises forming a solder connection on the bonding pad.

In an aspect of the invention, a method comprises forming a metal material on a substrate. The method further comprises patterning the metal material to form a bottom plate of a metal-insulator-metal (MIM) capacitor and a bonding pad in a single masking process. The method further comprises forming a MIM dielectric on the bottom plate. The method further comprises forming at least one metal layer on the MIM dielectric and a Ball Limiting Metallurgy (BLM) on the bonding pad in a same metal deposition process. The method further comprises forming a solder connection on the bonding pad.

In an aspect of the invention, a structure comprises: a metal-insulator-metal (MIM) capacitor comprising: an aluminum bond pad as a bottom plate, the aluminum bond pad being formed on a substrate; a dielectric directly on the bottom plate; and a top plate of Ball Limiting Metallurgy (BLM) material; and a solder connection, comprising: another aluminum bond pad formed on the substrate; the BLM material on the bond pad; and a solder ball on the BLM material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MIM capacitor, which comprises the structures of the present invention. In still further embodiments, a method in a computer-aided design system is provided for generating a functional design model of the MIM capacitor. The method comprises generating a functional representation of the structural elements of the MIM capacitor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a metal-insulator-metal (MIM) capacitor using barrier layer metallurgy and methods of manufacture. More specifically, the present invention is directed to a MIM capacitor using barrier layer metallurgy for a top plate and wiring and methods of manufacturing. Advantageously, the MIM capacitor can be manufactured in a copper (CU) back end of the line (BEOL) process, with reduced masking steps. This, in turn, results in reduced manufacturing processes and, hence, costs.

Aluminum (Al) bond pads are often required for devices with a Cu BEOL. The Al bond pads make it easier to use conventional wire bond and solder bump technology (compared to using a Cu bond pad). In embodiments of the present invention, the MIM capacitor uses an Al bond pad as the bottom plate of the MIM capacitor. A dielectric such as SiN, $Ta_2O_5$, $Al_2O_3$ or $SiO_2$ is deposited on top of the Al bond pad, and is used as the MIM capacitor dielectric. The top plate can be formed through different processes, such as either an under "bump" or Ball Limiting Metallurgy (BLM) or with a patterned TiN or Al/TiN layer, amongst others. The wiring can be formed using either the BLM or using a solder bump and wiring in a package, for example.

Figure 1:
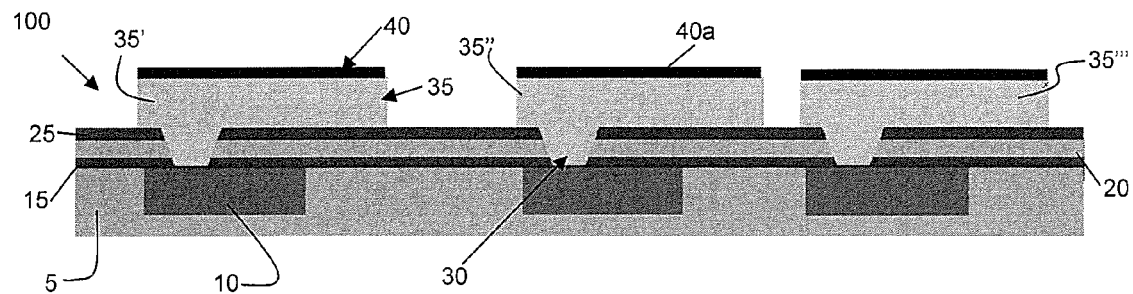
FIGS. 1-4 show structures and respective processing steps in accordance with aspects of the present invention.

FIG. 1 shows a beginning structure and respective processing steps in accordance with aspects of the present invention. In particular, the structure 100 includes an interlevel dielectric material 5. In embodiments, the interlevel dielectric 5 can be, for example, an oxide material such as $SiO_2$. Wiring 10 can be formed within the interlevel dielectric 5 using a subtractive or additive process, known to those of skill in the art. For example, the wiring 10 can be formed using a conventional damascene process. The conventional damascene process includes, for example, forming trenches within the dielectric material 5 using conventional lithography processes, followed by a deposition of metal, e.g., copper, and a polishing, e.g., chemical mechanical polishing (CMP). Subsequent layers 15, 20 and 25 can be deposited using conventional deposition methods, e.g., chemical vapor deposition (CVD) processes. In embodiments, the layers 15, 20, 25 can be, for example, a SiN layer 15, followed by an interlevel dielectric layer 20, e.g., SiO$_2$, followed by another SiN layer 25.

Still referring to FIG. 1, vias 30 can be formed through the layers 15, 20, 25, exposing a top surface of the wiring 10. In embodiments, the vias 30 are formed using conventional lithography processes, known to those of skill in the art. For example, a resist is formed over the layer 25 and exposed to energy (light) to form a pattern (openings). An etching process, e.g., reactive ion etching (RIE), is performed through the openings to form the vias 30. The resist is then removed using conventional oxygen ashing processes, for example.

A patterned metal material (e.g., bond pad, MIM plate and/or wiring layer) 35 is formed in the vias 30, which is capped with an insulating material 40, e.g., SiN. In embodiments, in forming the patterned metal material 35, aluminum can be deposited within the via 30 and directly on the layer 25, using any well known and appropriate deposition process, e.g., sputter deposition processes. In embodiments, the patterned metal material 35 can be used as (i) an aluminum bond pad 35', a bottom plate of a MIM capacitor 35" and an optional wiring 35''', all of which can be formed simultaneously with a deposition process and singe masking process. The insulating material 40 is then deposited on the aluminum layer (bottom plate 35). The insulating material 40 can be, for example, SiN, Ta$_2$O$_5$, Al$_2$O$_3$ or SiO$_2$.

To pattern the metal material (and insulator), a resist is formed over the insulating material 40 and exposed to energy (light) to form a pattern (openings). An etching process, e.g., reactive ion etching (RIE), is then performed through the openings to form the patterned metal material 35, e.g., (i) an aluminum bond pad 35', bottom plate of a MIM capacitor 35" and optional wiring 35'''. The resist is then removed using conventional oxygen ashing processes, for example. In this way, an aluminum pad and insulator layer can be used as a bottom plate and MIMCAP dielectric for the MIM capacitor, and can be formed in same processes for the formation of a bonding pad 35' and MIMCAP dielectric 40a, and a wiring 35''' in accordance with aspects of the present invention.

Figure 2:
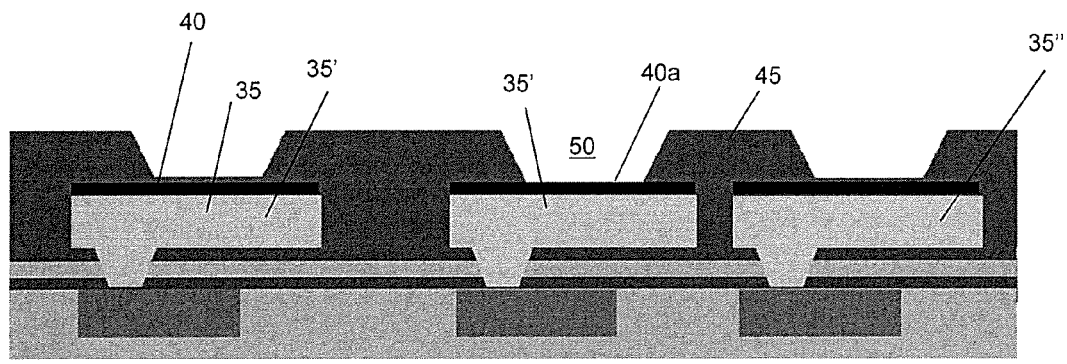

In FIG. 2, a passivation layer 45 is formed on the patterned metal material 35, e.g., (i) an aluminum bond pad 35', bottom plate of a MIM capacitor 35" and optional wiring 35''', and insulating material 40. In embodiments, the passivation layer 45 is a photosensitive polyimide material that can be patterned by exposure to light to form vias 50. In embodiments, the vias 50 will expose a top surface of the insulating material 40 (e.g., MIMCAP dielectric). In alternative embodiments, the passivation layer 45 can be a hard dielectric material, which can be patterned with resist pattern and etching processes. In embodiments, the passivation layer 45 is a final passivation layer.

Figure 3:
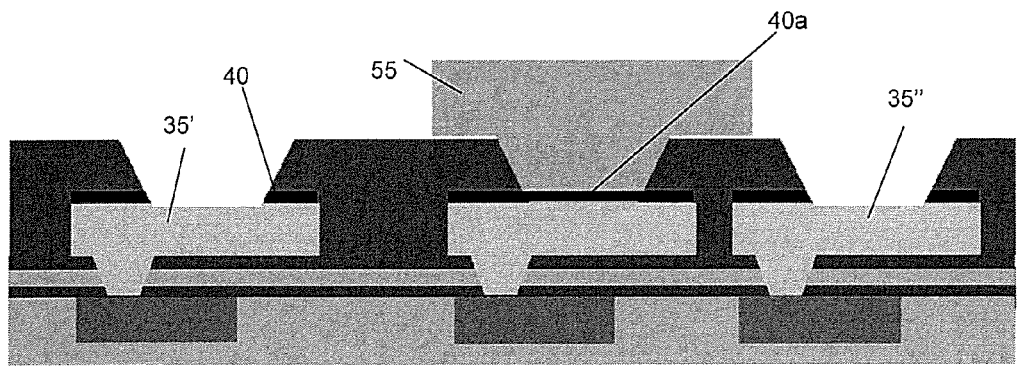

Referring to FIG. 3, the insulating material 40 can be removed over selected patterned metal material 35, e.g., (i) an aluminum bond pad 35' and optional wiring 35'''. In optional embodiments, the wiring 35''' can also be used as a bottom plate. This removal process can be provided by conventional etching processes, using a resist pattern 55 protecting the MIMCAP dielectric 40a. The removal of the insulating material will expose selected bottom plates (bonding pads) 35'. It should be understood by those of skill in the art that the resist pattern 55 can be formed over any selected of the MIMCAP dielectrics, in order to protect the insulating material 40a (MIMCAP dielectric) from etching processes. The resist pattern 55 can be removed using conventional oxygen ashing processes.

Figure 4:
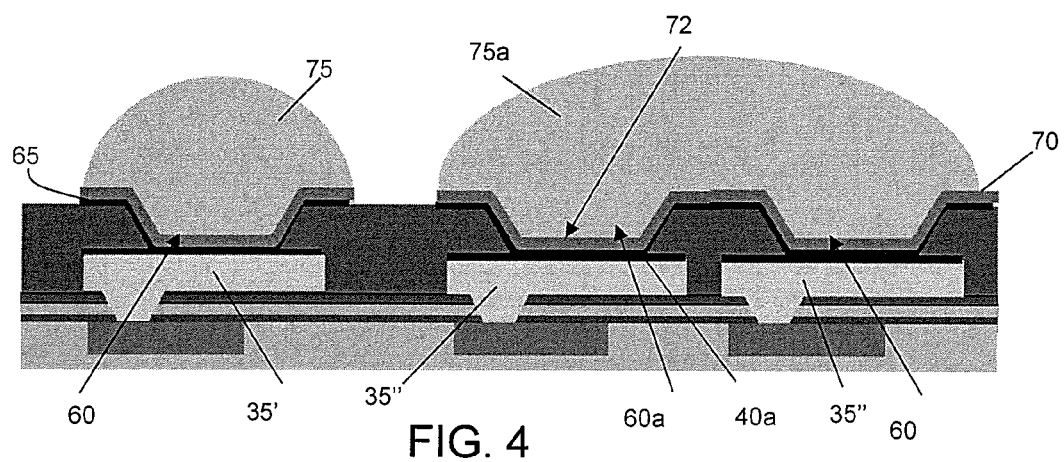

In FIG. 4, a ball metallurgy layer (BLM) is formed within vias 60 and 60a. In embodiments, the BLM can comprise a TiW layer 65 and a Cu or CrCu layer 70. In embodiments, the layers 65 and 70 can be other metals such as, for example, TiN or Al/TiN, which form a top plate 72 of the MIM capacitor in the via 60a and a bonding pad in the vias 60. More specifically, in embodiments, the layers 65 and 70 are deposited within vias 60, directly contacting the bonding pad 35' (and optional wiring 35'''); whereas, the layers 65 and 70 are deposited within via 60a, directly contacting the MIMCAP dielectric 40a. As should be appreciated by those of skill in the art, the layers 35', 40a, 65 and 70 can form a MIM capacitor, using the underlying aluminum as a bottom plate. Thus, the underlying aluminum can be used as a bottom plate for a MIM capacitor and a bonding pad for a solder ball 75, formed with a single masking step.

Still referring to FIG. 4, the solder ball 75 can be formed directly on a bonding pad 35' using any conventional processes. For example, in embodiments, the solder ball 75 can be formed using a stencil and solder mask, as should be known to those of ordinary skill in the art. In alternative embodiments, the solder ball 75 can be formed using a plating process or a glass template. In further embodiments, an optional solder ball 75a can be formed within any combination of vias 60 and 60a. In these configurations, the solder balls 75 and 75a can act as a masking layer for the patterning of the layers 65 and 70, for example. In embodiments, the layers 65, 70 can be etched using a wet etching process using the solder balls as a mask, or alternatively with a resist pattern.

Figure 5:
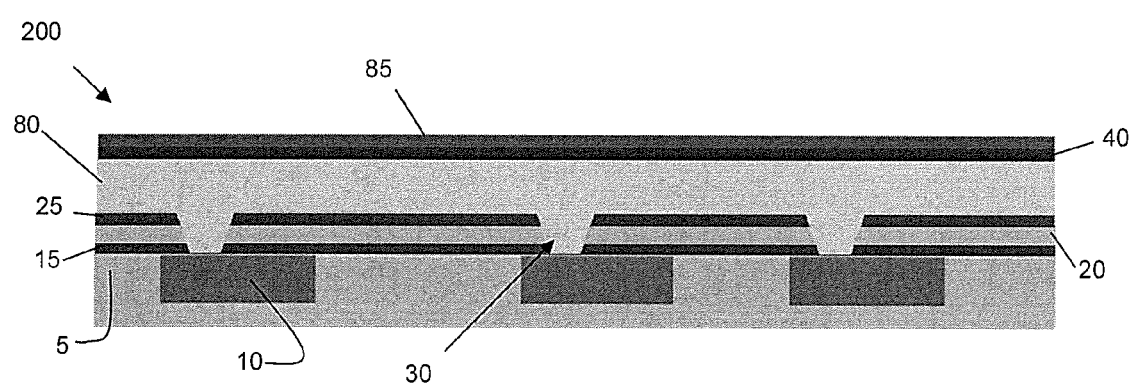
FIGS. 5-9 show structures and respective processing steps in accordance with additional aspects of the present invention.

FIG. 5 shows a beginning structure and respective processing steps in accordance with aspects of the present invention. In particular, the structure 200 includes an interlevel dielectric material 5. In embodiments, the interlevel dielectric 5 can be, for example, an oxide material such as SiO$_2$. Wiring 10 can be formed within the interlevel dielectric 5 using a subtractive or additive process, known to those of skill in the art. For example, the wiring 10 can be formed using a conventional damascene process as described herein, e.g., lithography, deposition of metal and polishing. Subsequent layers 15, 20 and 25 can be deposited using conventional deposition methods, e.g., chemical vapor deposition (CVD) processes. In embodiments, the layers 15, 20, 25 can be, for example, a SiN layer 15, followed by an interlevel dielectric layer 20, e.g., SiO$_2$, followed by another SiN layer 25.

Still referring to FIG. 5, vias 30 are formed through the layers 15, 20, 25, exposing a top surface of the wiring 10. In embodiments, the vias 30 are formed using conventional lithography processes, known to those of skill in the art. For example, a resist is formed over the layer 25 and exposed to energy (light) to form a pattern (openings). An etching process, e.g., reactive ion etching (RIE), is performed through the openings to form the vias 30. The resist is then removed using conventional oxygen ashing processes, for example.

A metal material 80 is formed in the vias 30 and over the layer 25. In embodiments, the metal material 80 can be aluminum, which is patterned in later processes to form a bonding pad and a bottom plate of a MIM capacitor. Accordingly, the metal material 80 can be used as a bottom plate for a MIM capacitor and a bonding pad for a solder ball, using only a single masking step. More specifically, aluminum can be deposited within the vias 30 and directly on the layer 25, using any well known and appropriate deposition process, e.g., atomic layer deposition (ALD) processes.

An insulating material 40, e.g., SiN, is formed over the metal material 80. In embodiments, the insulating material 40 can be, for example, SiN, Ta$_2$O$_5$, Al$_2$O$_3$ or SiO$_2$, deposited using conventional deposition processes. A metal layer 85 can be formed on the insulating material 40, to form a top plate of a MIM capacitor. In embodiments, the metal layer 85 can be, for example, TiN or Al/TiN, formed using conventional sputter deposition processes, for example.

Figure 6:
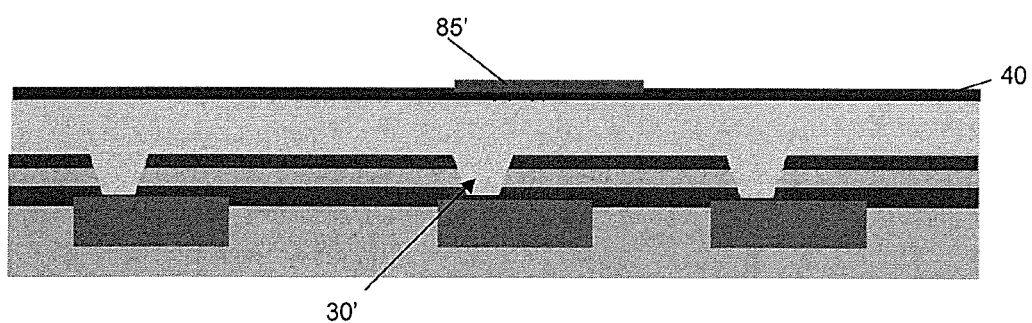

In FIG. 6, the metal layer is patterned to form a patterned metal 85', using conventional lithography and etching processes. For example, a resist is formed over the metal layer and exposed to energy (light) to form a pattern (openings). An etching process, e.g., reactive ion etching (RIE), is then performed through the openings to form the patterned metal layer 85' and overlying insulating material 40. The resist is then removed using conventional oxygen ashing processes, for example. The patterned metal layer 85' is preferably aligned with via 30'.

Figure 7:
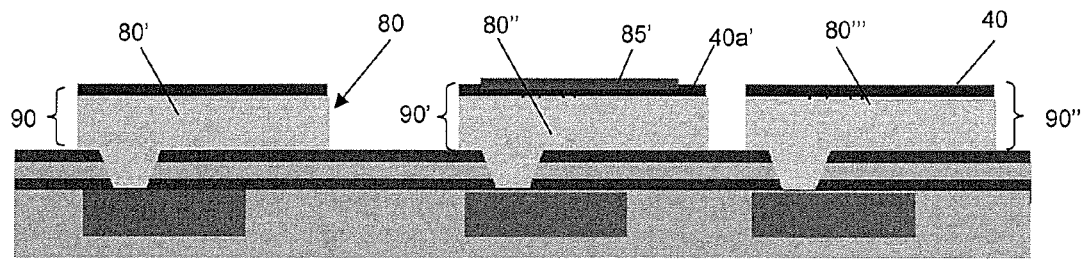

In FIG. 7, the insulating material 40 and the metal layer 80 are patterned using conventional lithography and etching processes. For example, a resist is formed over the patterned metal layer 85', insulating layer 40 and metal layer 80. The resist is exposed to energy (light) to form a pattern (openings). An etching process, e.g., reactive ion etching (RIE), is then performed through the openings to form the patterned islands 90 and 90' and 90", where island 90' includes patterned metal layer 85'. The resist is removed using conventional oxygen ashing processes, for example. In this way, using a single masking step, it is now possible to form the following structures:

the patterned island 90 which includes an aluminum bond pad 80',
the patterned island 90' which includes a bottom plate 80", a MIM dielectric 40a' and a top plate 85' of a MIM capacitor, and the patterned island 90" which includes a wiring layer 80".

Figure 8:
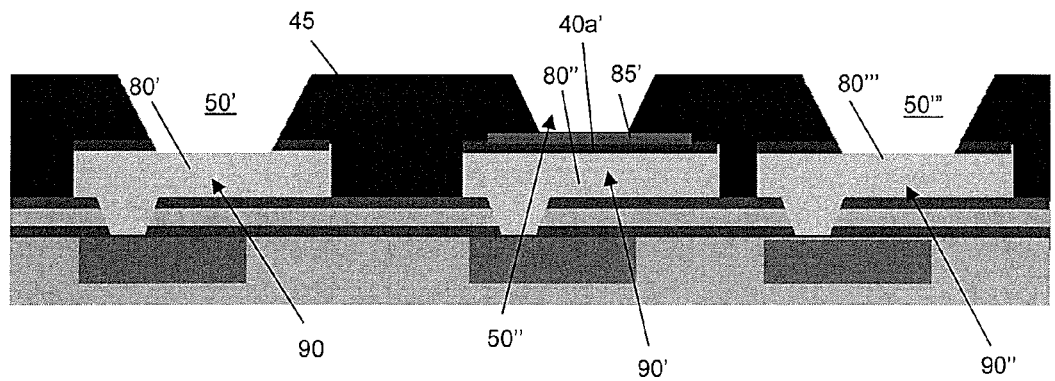

In FIG. 8, a passivation layer 45 is formed on the patterned islands 90, 90', 90", respectively. In embodiments, the passivation layer 45 is a photosensitive polyimide material that can be patterned by exposure to light to form vias 50', 50" and 50'''. In embodiments, the vias 50', 50" and 50''' correspond with the patterned islands 90, 90', 90". In forming the vias 50', 50" and 50''', the aluminum bond pad 80' will be exposed on the patterned island 90 and the wiring layer 80''' will be exposed on patterned island 90"; whereas, the bottom plate 80" remains covered by the MIM dielectric 40a'. In alternative embodiments, the passivation layer 45 can be a hard dielectric material, which can be patterned with resist pattern and etching processes. In embodiments, the passivation layer 45 is a final passivation layer.

Figure 9:
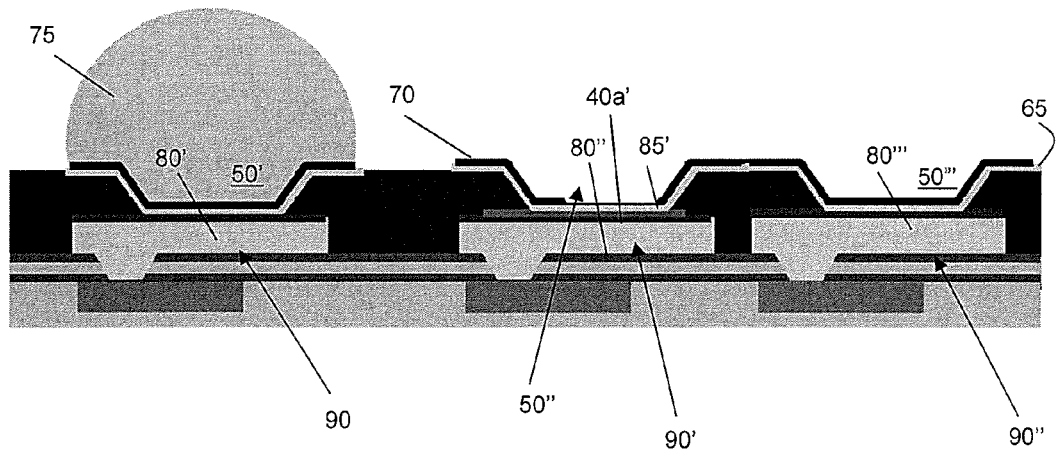

Referring to FIG. 9, a bottom metallurgy layer (BLM) is formed within vias 50', 50" and 50'''. In embodiments, the BLM can comprise a TiW layer 65 and a Cu or CrCu layer 70. In embodiments, the layers 65 and 70 can be other metals such as, for example, TiN or Al/TiN, which can also be used to form a top plate of the MIM capacitor in the via 50". As should be appreciated by those of skill in the art, the layers 80", 40a', 85', 65 and 70 can form a MIM capacitor, using the underlying aluminum as a bottom plate. Thus, the underlying aluminum can be used as a bottom plate for a MIM capacitor and a bonding pad for a solder ball 75, using only a single masking step.

Still referring to FIG. 9, the solder ball 75 can be formed directly on a bonding pad 80' using any conventional processes. For example, in embodiments, the solder ball 75 can be formed using a stencil and solder, as should be known to those of ordinary skill in the art. In alternative embodiments, the solder ball 75 can be formed using a plating process or a glass template. In further embodiments, a solder ball can also be formed within any combination of vias. In embodiments, the layers 65, 70 can be etched using a wet etching process using the solder balls as a mask, or alternatively with a resist pattern.

Figure 10:
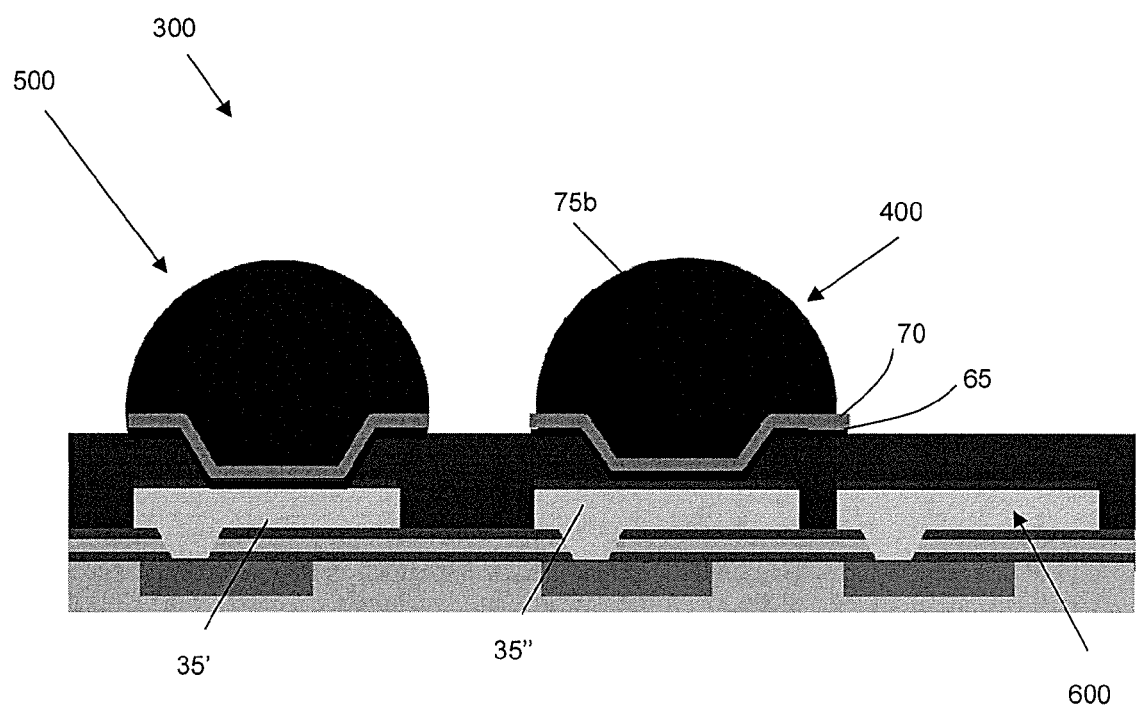
FIG. 10 shows a structure and respective processing steps in accordance with further aspects of the present invention.

FIG. 10 shows a structure and respective processing steps in accordance with further aspects of the present invention. In the structure 500 of FIG. 10, solder ball 75b can be formed over the MIM capacitor 400, to act as a mask, similar to that which was described with reference to FIG. 4. Specifically, the solder ball 75b can protect the underlying metal layers 65 and 70 over the MIM capacitor 400 during etching processes which remove metal layers 65 and 70 over the wiring layer 600, for example.

In embodiments, the MIM capacitor 400 can be formed in the manner described herein, including using the materials and processes particularly described with regard to FIGS. 1-4. In addition, a solder ball connection structure 500 can be formed in the manner described herein, including using the materials and processes particularly described with regard to FIGS. 1-4. Moreover, the wiring layer 600 can be formed simultaneously and with the same materials as the underlying bonding pad 35' of the solder ball connection structure 500 and the bottom plate 35" of the MIM capacitor 400, e.g., aluminum deposition and a single masking step (which is also used to form a bottom plate of the MIM capacitor). In this aspect of the invention, a via will not be formed over the wiring layer 600. This can be accomplished by simply protecting this area during via formation (e.g., etching processes).

Figure 11:
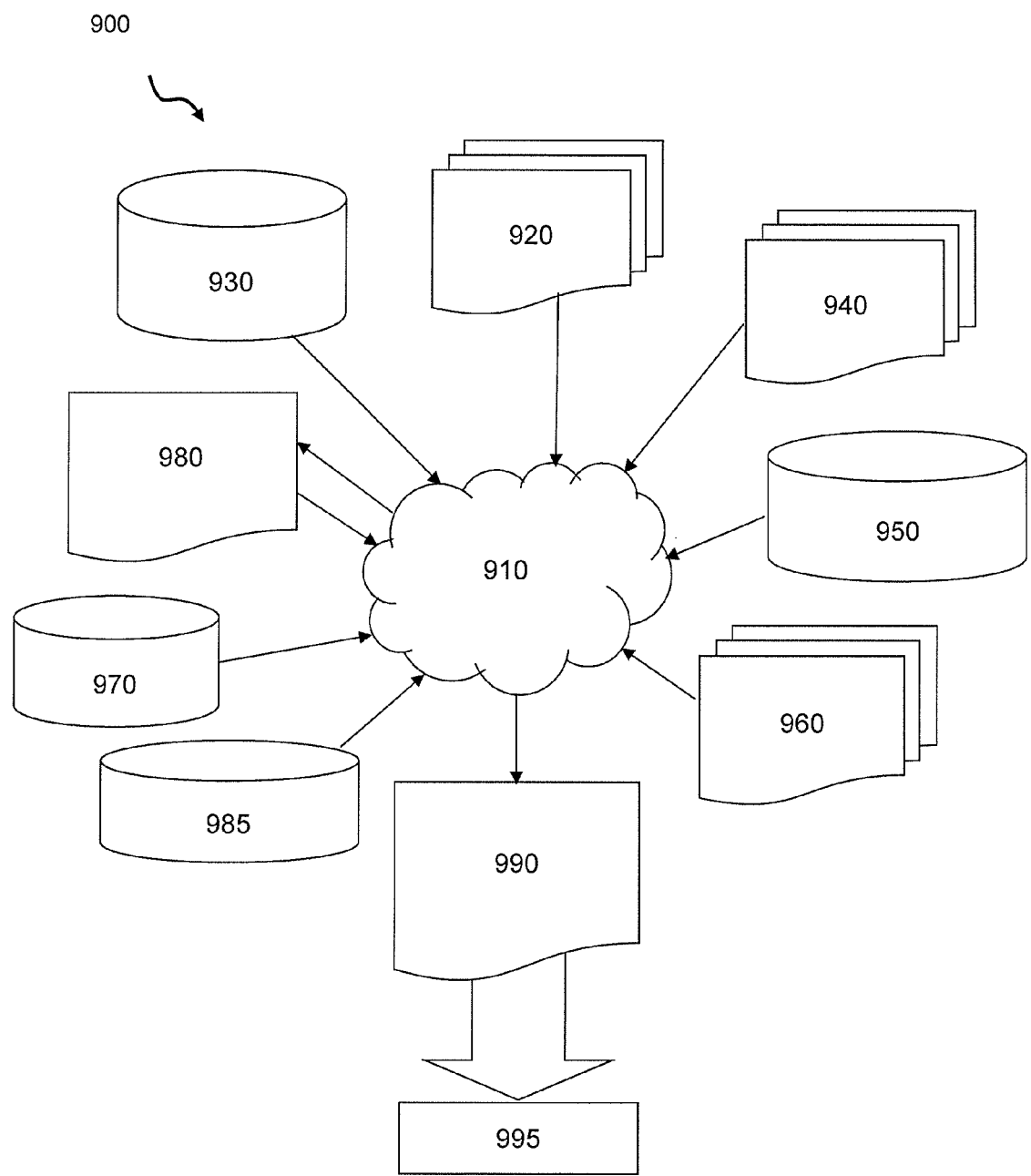
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 9 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of forming a structure, comprising:
forming wiring structures in an interlevel dielectric layer;
forming multiple layers over the wiring structures;
forming vias in the multiple layers, aligned with and exposing a surface of the wiring structures, respectively;
forming a bottom plate of a metal-insulator-metal (MIM) capacitor and a bonding pad on an upper surface of the multiple layers and extending within the vias and in contact with a respective one of the wiring structures formed in the interlevel dielectric layer, using a single masking process;
forming a dielectric layer on the bottom plate and the bonding pad using a same deposition step;
removing the dielectric layer on the bonding pad, while protecting the dielectric layer on the bottom plate which forms a MIM dielectric;
forming a top plate of the MIM capacitor on the MIM dielectric and a Ball Limiting Metallurgy (BLM) on the bonding pad using a same deposition step; and
forming a solder connection on the bonding pad.

2. The method of claim 1, wherein the bottom plate and the bonding pad are formed by a single metal deposition process and an etching process using the single masking step.

3. The method of claim 2, wherein the bottom plate and the bonding pad are formed by an aluminum deposition process.

4. The method of claim 1, wherein the BLM and the top plate are formed by depositing a same metal material on the MIM dielectric and on the bonding pad in the same deposition process.

5. The method of claim 4, further comprising patterning the metal material over the bonding pad, using the solder connection as a masking layer.

6. The method of claim 5, further comprising forming another solder connection over the top plate of the MIM capacitor, and patterning the metal material using the another solder connection.

7. The method of claim 1, wherein the MIM dielectric comprises depositing one of SiN, $Ta_2O_5$, $Al_2O_3$ and $SiO_2$ over the bottom plate.

8. The method of claim 1, wherein the forming of the top plate of the MIM capacitor comprises forming and patterning a metal layer on the MIM dielectric, prior to forming the Ball Limiting Metallurgy (BLM).

9. The method of claim 1, further comprising forming a wiring using the single masking step which forms the bottom plate of the MIM capacitor and the bonding pad.

10. The method of claim 9, wherein the forming of the wiring comprises a same metal deposition as the bottom plate of the MIM capacitor and the bonding pad.

11. A method comprising:
forming wiring structures in an interlevel dielectric layer;
forming multiple layers over the multiple wiring structures;
forming vias in the multiple layers, aligned with and exposing a surface of the wiring structures;
forming a metal material on an upper surface of the multiple layers, within the vias and in direct contact with the surface of the wiring structures;
patterning the metal material to form a bottom plate of a metal-insulator-metal (MIM) capacitor and a bonding pad in a single masking process;
forming a MIM dielectric on the bottom plate and the bonding pad;
removing the MIM dielectric layer on the bonding pad, while protecting the MIM dielectric layer on the bottom plate;
forming at least one metal layer on the MIM dielectric and a Ball Limiting Metallurgy (BLM) on the bonding pad in a same metal deposition process; and
forming a solder connection on the bonding pad.

12. The method of claim 11, wherein the metal material is aluminum.

13. The method of claim 11, wherein the forming of the at least one metal layer forms a top plate of the MIM capacitor.

14. The method of claim 13, wherein the forming of the at least one metal layer comprises forming at least two metal layers.

15. The method of claim 11, further comprising forming a top plate on the MIM dielectric by deposition and patterning of a metal on the MIM dielectric.

16. The method of claim 15, wherein the at least one metal layer is formed subsequent to the forming of the top plate, prior to the forming the at least one metal layer.

17. The method of claim 11, wherein the solder connection acts as a mask to pattern the at least one metal layer.

18. The method of claim 11, further comprising forming a wiring from the metal material using the single masking step which forms the bottom plate of the MIM capacitor and the bonding pad.

19. A structure comprising:
wiring structures in an interlevel dielectric layer;
multiple layers over the multiple wiring structures;
vias in the multiple layers, aligned with and exposing a surface of the wiring structures;
a metal-insulator-metal (MIM) capacitor comprising:
an aluminum bond pad as a bottom plate, the aluminum bond pad being formed within one of the vias and in contact with a wiring of the multiple wiring structures;
a dielectric directly on the bottom plate; and
a top plate of Ball Limiting Metallurgy (BLM) material; and
a solder connection, comprising:
another aluminum bond pad formed within another of the vias and in contact with another wiring of the multiple wiring structures;
the BLM material on the bond pad; and
a solder ball on the BLM material.

20. The structure of claim 19,
further comprises a metal layer in direct contact with the dielectric and directly under the BLM material and in direct contact therewith; and
the BLM material is two metal layers.

* * * * *